US008283578B2

(12) United States Patent
Janes et al.

(10) Patent No.: US 8,283,578 B2
(45) Date of Patent: Oct. 9, 2012

(54) ELECTRICAL DEVICE, SYSTEM AND METHOD FOR OPERATING WITH REDUCED ACOUSTIC NOISE GENERATION

(75) Inventors: Peter Janes, Ontario (CA); Riazuddin R. Shaikh, Ontario (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 761 days.

(21) Appl. No.: 12/336,669

(22) Filed: Dec. 17, 2008

(65) Prior Publication Data

US 2010/0147572 A1  Jun. 17, 2010

(51) Int. Cl.
*H05K 7/14* (2006.01)
(52) U.S. Cl. ........................................ 174/544; 174/548
(58) Field of Classification Search .................. 174/535, 174/541, 544, 548
See application file for complete search history.

(56) References Cited

U.S. PATENT DOCUMENTS

| 7,180,173 | B2 * | 2/2007 | Kuo et al. ...................... 257/706 |
| 2005/0067178 | A1 * | 3/2005 | Pearson et al. ................ 174/520 |

OTHER PUBLICATIONS

Soundcoat; Damping Products; Sep. 2007; Irvine, CA 92606; www.soundcoat.com; (2 pages).
PowerFlex 7000, Medium Voltage Drives from Allen-Bradley; www.ab.com/mvb/pf7000; (7 pages).
Technical Data Sheet; Whisperdamp VE vinyl based vibration damping sheets; Apr. 2003, American Acoustical Products, Holliston, MA; info@aapusa.com (1 page).
Technical Data Sheet; DBL Sound and vibration damping sheets;Oct. 2004, American Acoustical Products, Holliston, MA; info@aapusa.com (1 page).
Holtz, J. Pulsewidth Modulation for Electronic Power Conversion; IEEE Standard for Performance of Adjustable Speed AC Drives rated 375 kW and larger; Petroleum and Chemical Industry Committee; IEEE, vol. 82, No. 8, Aug. 1994, pp. 1194-1214; (20 pages).
Lockley, B.; Wood, B.; Paes, R.; Dewinter, F.; Drive system requirement in performance, IEEE Standard 1566 for (Un)Familiar hands; Jan.-Feb. 2008; vol. 14, Issue: 1, pp. 21-28.

* cited by examiner

*Primary Examiner* — Hung Ngo
(74) *Attorney, Agent, or Firm* — Whyte Hirschboeck Dudek S.C.; Alexander R. Kuszewski

(57) ABSTRACT

Disclosed herein is a device for reducing noise generated by an electrical component, the device including a stiffening component secured to an electrical component, wherein the stiffening component provides rigidity to the electrical component, thereby reducing the mechanical resonance of the electrical component during operation. The electrical component has at least one end face and a flange portion that includes a flange face that extends about a perimeter of the end face. The flange face is substantially parallel to the end face, wherein the stiffening component is secured to the flange face of the electrical component such that it does not extend into a plane of the end face. Further, the stiffening component can include a stiffening portion and a securing portion, wherein the stiffening portion is secured to the flange face of the electrical component by the securing portion. Further, the electrical component can be a power semiconductor device.

19 Claims, 2 Drawing Sheets

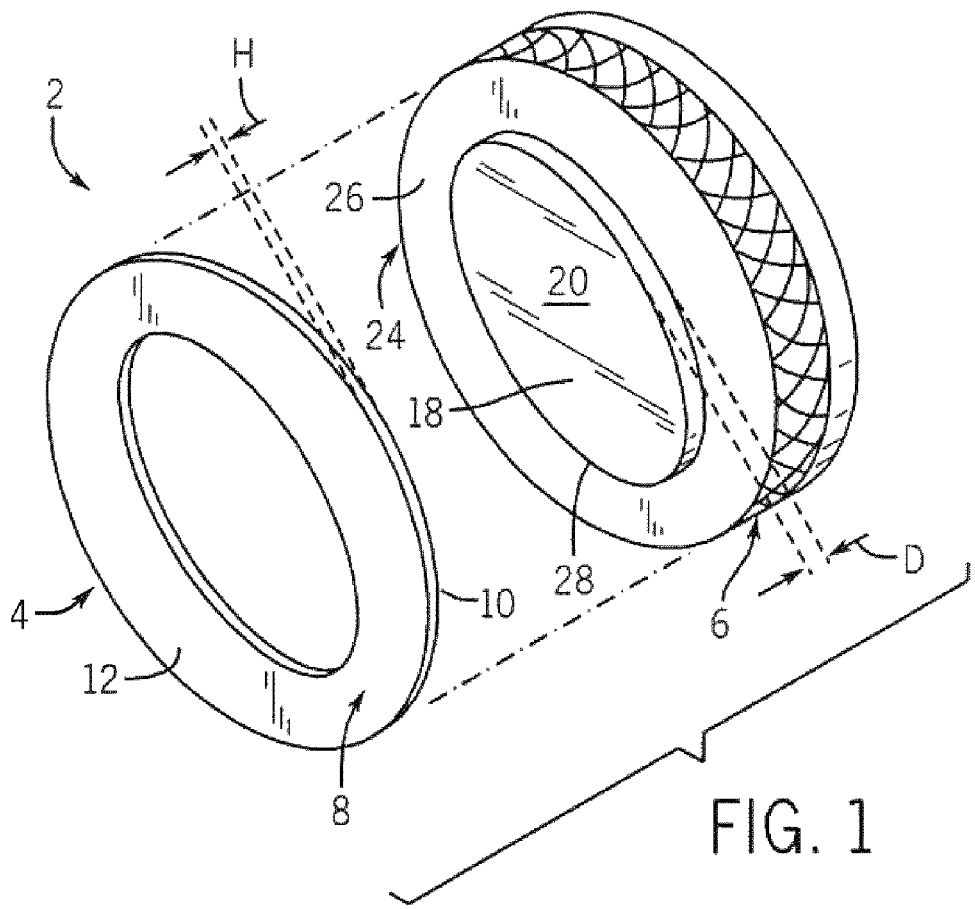
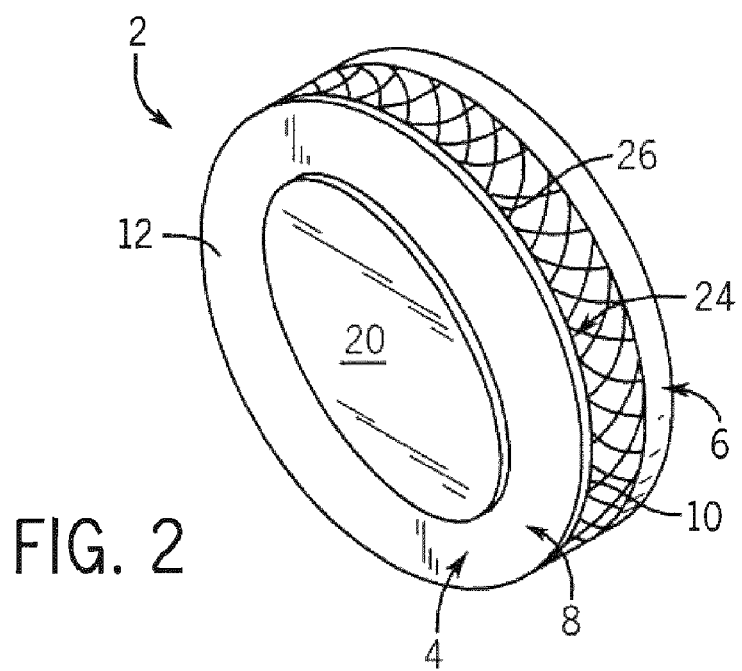

ELECTRICAL DEVICE, SYSTEM AND METHOD FOR OPERATING WITH REDUCED ACOUSTIC NOISE GENERATION

CROSS-REFERENCE TO RELATED APPLICATIONS

Not Applicable

STATEMENT REGARDING FEDERALLY SPONSORED RESEARCH OR DEVELOPMENT

Not Applicable

FIELD OF THE INVENTION

The present invention relates to electrical devices and, more particularly, to systems and methods for reducing acoustic noise generated due to the operation of electrical devices.

BACKGROUND OF THE INVENTION

Power electronic devices are often used in high power applications, such as those commonly found in industries such as Petrochemical, Food & Beverage, Mining & Metals, Utilities and Water/Wastewater. These devices include semiconductor devices that provide control for high power systems such as motor drive units. High power semiconductor devices often conduct high levels of current, and often include one or more high-speed switching components that alter the flow of such current as a result of switching operations. Such changing current flow in turn produces rapidly-changing magnetic fields. These fields exert Lorentz forces on current-carrying conductors, which can result in mechanical resonance in the high power semiconductor devices.

Such mechanical resonance occurring in high power semiconductor devices (or other electrical devices) can sometimes produce an audible level of acoustic noise that is undesirable. Sometimes the acoustic noise not only is undesirable but also can exceed standards which are applicable for acoustic noise levels, such that one or more noise reduction techniques should be implemented so that the motor drive unit (which houses the devices) is compliant with applicable standards such as those published by IEEE and OSHA.

Accordingly, it would be advantageous if a system and/or method for reducing the levels of acoustic noise generated by electrical devices could be developed.

BRIEF SUMMARY OF THE INVENTION

The present inventor has recognized that conventional electrical components can be modified and improved to reduce acoustic noise generated during their operation, so as to address one or more of the above-discussed drawbacks of conventional electronic components and acoustic noise reduction methods.

In at least some embodiments, the present invention relates to a device for reducing noise generated by an electrical component. The device includes a stiffening component securable to the electrical component, wherein the stiffening component provides rigidity to the electrical component, whereby, due to the presence of the stiffening component, a level of acoustic noise resulting from operation of the electrical component is reduced relative to what the level would otherwise be if the stiffening component were absent. In at least some such embodiments, the stiffening component reduces the mechanical resonance of the electrical component during operation. In some such embodiments, the stiffening component can include a substantially rigid material, such as aluminum. In other embodiments the stiffening component can include a mineral fiber or an acoustic coating. In at least one embodiment, the stiffening component is an annular structure defining an interior cavity, and is configured to be secured to the electrical component in a manner by which a portion of the electrical component extends through the interior cavity. Further, in some embodiments, the stiffening component can include a stiffening portion and a securing portion.

In at least some embodiments, the electrical component can further include a flange portion situated about a perimeter of the electrical component, wherein the stiffening component is secured to the flange portion. In at least one embodiment, the electrical component can have at least one end face and a flange portion that includes a flange face that extends about a perimeter of the end face, the flange face being substantially parallel to the end face, wherein the stiffening component is secured to the flange face of the electrical component such that it does not extend into a plane of the end face. In one or more embodiments, at least one end face of the electrical component can be an anode and another end face a cathode. In addition, in at least one embodiment, the stiffening portion can be secured to the flange face of the electrical component by the securing portion. In at least some embodiments, the securing portion can include an adhesive or a mechanical fastener, and the stiffening portion can be comprised of aluminum (e.g., aluminum foil) or another rigid or semi-rigid material.

In at least some embodiments, the electrical component can be a semiconductor device, such as an insulated gate bipolar transistor (IGBT), a symmetrical gate commutated thyristor (SGCT), integrated gate commutated thyristor (IGCT), a silicon-controlled rectifier (SCR), or any other press-pack semiconductor device. Additionally, in at least one embodiment, the semiconductor device can be part of a gate driver circuit, and can be included in a motor drive unit. Still further in some embodiments, the stiffening component can be ring-shaped and between about 0.2 millimeters and about 0.6 millimeters in height. In at least one embodiment, the securing portion can be comprised of at least one of an adhesive and a mechanical fastener, and the stiffening portion is aluminum.

In at least some further embodiments, the present invention relates to a method of operating an electrical component. The method includes providing a stiffening component having a stiffening portion and a securing portion, and securing the stiffening component to the electrical component by way of the securing portion, wherein the stiffening portion provides rigidity to the electrical component. The method additionally includes operating the electrical component electrically, whereby, due to the presence of the stiffening component, a level of acoustic noise resulting from the operating of the electrical component is reduced relative to what the level would otherwise be if the stiffening component were absent. Additionally, in at least some such embodiments, the method can include using a semiconductor device, wherein the semiconductor device is at least one of an insulated gate bipolar transistor (IGBT), a symmetrical gate commutated thyristor (SGCT), integrated gate commutated thyristor (IGCT), a silicon-controlled rectifier (SCR), or any other press-pack semiconductor device.

In at least some further embodiments, the present invention relates to an electrical system configured to operate with reduced acoustic noise generation. The system includes a stiffening component having a stiffening portion secured to a securing portion, and a semiconductor device having at least one substantially planar end face with a flange portion situated about a perimeter of the end face, wherein the stiffening component is secured to the semiconductor device, thereby providing additional rigidity to the flange portion, whereby due to the presence of the stiffening component, a level of acoustic noise resulting from operation of the semiconductor device is reduced relative to what the level would otherwise be if the stiffening component were absent.

Other embodiments, aspects, features, objectives, and advantages of the present invention will be understood and appreciated upon a full reading of the detailed description and the claims that follow.

BRIEF DESCRIPTION OF THE DRAWINGS

Embodiments of the invention are disclosed with reference to the accompanying drawings and are for illustrative purposes only. The invention is not limited in its application to the details of construction or the arrangement of the components illustrated in the drawings. The invention is capable of other embodiments or of being practiced or carried out in other various ways. The drawings illustrate a best mode presently contemplated for carrying out the invention. Like reference numerals are used to indicate like components. In the drawings:

FIG. 1 is an exploded perspective view of an exemplary acoustic noise suppression device;

FIG. 2 is a perspective view of the acoustic noise suppression device of FIG. 1 when assembled;

DETAILED DESCRIPTION OF THE PREFERRED EMBODIMENT

Referring to FIG. 1, a perspective, exploded view is provided of an exemplary electrical system 2 that is capable of operating without producing acoustic noise, or at least without producing as much acoustic noise as would be produced by a conventional electrical device performing the same electrical function(s). As shown, the electrical system 2 in particular includes both a stiffening component 4 and an electrical component 6. The electrical component 6 is intended to be representative of any of a variety of electrical components that produce acoustic noise, and particularly is intended to encompass any of a variety of electrical components that produces acoustic noise as a result of mechanical resonance that can occur, for example, due to rapid switching operation that involves rapid variations in high levels of current.

Although not intended to be limited to such components, the present invention in particular is intended to encompass embodiments in which the electrical component 6 is a power electronic device such as a semiconductor device. The semiconductor device can be, for example, a press-pack semiconductor device and/or a thyristor such as an IGBT (insulated gate bi-polar transistor), a SGCT (switching gate commutated thyristor), an IGCT (integrated gate commutated thyristor), or an SCR (silicon-controlled rectifier) or any other press-pack power semiconductor device. These power electronic devices are capable of passing large amounts of switched current therethrough, and therefore can generate substantial mechanical resonance, which in turn creates acoustic noise.

Figure 3:
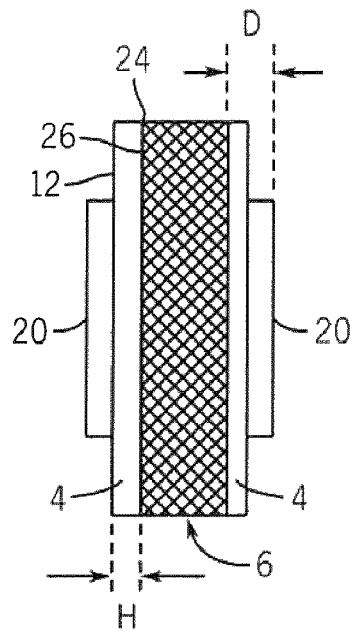
FIG. 3 is a side view of the acoustic noise suppression device of FIG. 1 when assembled.

Additionally as shown in FIGS. 2 and 3, which respectively show a perspective, unexploded (that is, assembled) view of the electrical system 2 and a side elevation view of the electrical system, the stiffening component 4 can be secured to the electrical component 6 to increase the rigidity of the electrical component 6. This additional rigidity reduces mechanical resonance, and therefore reduces the acoustic noise produced by such mechanical resonance that might otherwise occur due to operation of the electrical component 6 when energized. That is, by securing the stiffening component 4 to the electrical component 6, the mechanical resonance experienced by (and vibrational energy given off by) the electrical component can be reduced, thereby reducing some of the associated acoustic noise emanating from that electrical component directly and/or from one or more structures associated with that electrical component (e.g., circuit boards or other structures upon which the electrical component can be mounted).

The stiffening component 4 can take a variety of forms depending upon the embodiment. For example, the stiffening component 4 can have a variety of shapes, can have a variety of sizes and/or can be made from any of a variety of material (s), which can be configured in one or more layers. In the present embodiment shown in FIGS. 1-3, the stiffening component 4 is a substantially planar, annular structure that includes both a stiffening portion 8 and a securing portion 10. The stiffening portion 8 is made primarily of a rigid or semi-rigid material, such as aluminum, a mineral fiber, or a vinyl based material, although other stiffening materials can be employed.

Further as shown, the stiffening portion 8 includes an annular non-contact face 12 situated opposite another annular face that is in contact with the securing portion 10. In the present embodiment, the securing portion 10 is an adhesive layer that is secured to the stiffening portion 8 and is additionally used to secure the stiffening portion 8 (and thus the overall stiffening component 4) to the electrical component 6. The adhesive layer of the securing portion 10 can be made from any of a variety of types of adhesive that are capable of maintaining adhesion between the stiffening portion 8 and the electrical component 6 notwithstanding the mechanical resonance of the electrical component during its operation including, for example, a viscoelastic polymer acrylic or other acrylic adhesive.

Additionally as shown, in the present embodiment the stiffening component 4 (and particularly both the stiffening portion 8 and the securing portion 10) is shaped and sized to complementarily engage the electrical component 6. More particularly, the electrical component 6 in the present embodiment is a substantially cylindrical structure that includes a first end 18 and a second end (not shown). As shown, at the first end 18 the electrical component 6 includes a respective circular end face 20 and a respective recessed perimeter (or flange) portion 24 that includes an annular flange face 26 that extends along and around a perimeter 28 of the end face 20. Each of the circular end face 20 and annular flange face 26 extends within a respective plane perpendicular to the central axis of the electrical component 6, with both of the respective planes being parallel to one another and with the annular flange face being located farther inwardly into the electrical component 6 than the circular end face (and the planes of those two faces not intersecting).

When the electrical system 2 is fully assembled as shown in FIG. 2, the stiffening component 4 is positioned onto the electrical component 6 and particularly positioned around the circular end face 20, with the securing portion 10 of the stiffening component 4 in contact with the annular flange face 26. In the present embodiment, the outer diameter of the stiffening component 4 is identical to that of the annular flange face 26 (which is the maximum outer diameter of the electrical component 6), and the inner diameter of the stiffening component 4 is identical to (or slightly greater than) the outer diameter of the circular end face 20. Also, the height/thickness H (see FIG. 1) of the stiffening component 4 is less than a distance D between the planes of the circular end face 20 and the annular flange face 26. Consequently, when assembled, the presence of the stiffening component 4 does not cause the diametric or lengthwise dimensions of the electrical component 6 to be appreciably increased, but rather merely causes the electrical component 6 to take on a shape that is more closely that of a cylinder.

Although not particularly shown in FIGS. 1 and 2, FIG. 3 illustrates that in at least some embodiments the electrical system 2 includes not only one stiffening component 4 that is provided at the first end 18 of the electrical component 6, but instead can have a symmetrical design in which two stiffening components are respectively provided at each of the opposite ends of the electrical component. That is, in such embodiments, the electrical component 6 can include two circular end faces 20, two recessed perimeter portions 24 and two annular flange faces 26 at the two respective ends of the electrical component, with respect to which two stiffening components can be respectively mounted.

An exemplary stiffening component 4, alone or in combination with another stiffening component 4, can provide a reduction of about 2 dBA's (Decibel-weighting) to about 6 dBA's, although a lesser or greater reduction in dBA's can be achieved depending on a multitude of factors. For example, factors such as the composition and size of the stiffening component 4, the characteristics of the electrical component 6, and the device that the stiffening component 4 and the electrical component 6 are situated in, can substantially effect the noise reduction.

The exact dimensions of the electrical component 6, stiffening component(s) 4 or any subportions thereof can vary depending upon the embodiment. In the present embodiment, for example, the distance D between the circular end face 20 and the annular flange face 26 at a given end of the electrical component 6 is about 1.28 millimeters, although the distance D can be lesser or greater in length. As for the stiffening component 4, the height/thickness H (that is, thickness as measured parallel to the central axis of the stiffening component) can range from about 0.2 millimeters to about 0.6 millimeters, for example 0.4 millimeters, although other heights can be utilized to conform to the size of the electrical component 6 (e.g., the height/thickness H of the stiffening component 4 and the distance D of the electrical component can be identical or nearly identical).

In addition to the generation of acoustic noise, electrical components such as power electronic devices often generate substantial heat that, if excessive, can undermine operation of those devices. In view of such considerations, the electrical system 2 discussed above is particularly designed to facilitate (or at least to avoid or minimize interfering with) the dissipation of heat from the electrical component 6.

Figure 4:
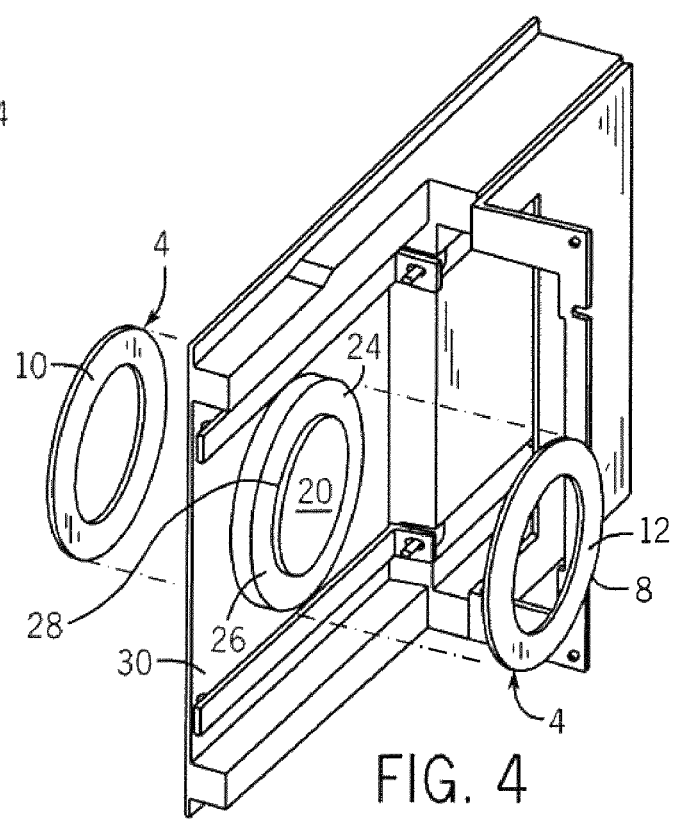
FIG. 4 is a perspective view of the acoustic noise suppression device of FIG. 1 when assembled and mounted on a gate driver board.
Figure 5:
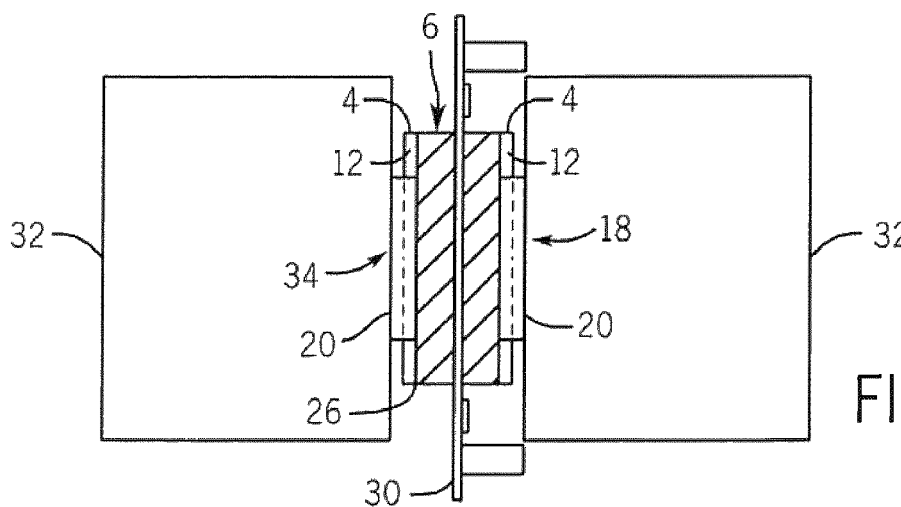
FIG. 5 is a side view of the acoustic noise suppression device mounted on the gate driver board as shown in FIG. 4, where the acoustic noise suppression device is further positioned in between a pair of heat dissipation (heat sink) devices.

Turning to FIG. 4, the electrical system 2 of FIG. 3 is shown with the two stiffening components 4 being exploded from the electrical component 6, and the electrical component being installed in a circuit board 30. Further referring to FIG. 5, the electrical system 2 and circuit board 30 of FIG. 4 are shown again, but in this case the stiffening components 4 are shown to be assembled to (unexploded from) the electrical component 6. As shown particularly in FIG. 5, the electrical component 6 is secured in the circuit board 30 in a manner such that the end faces 20 of both the first end 18 and a second end 34 are exposed on opposite sides of the circuit board 30. Further, although one stiffening component 4 is secured to each of the first end 18 and the second end 34 of the electrical component 6, the end faces 20 protrude outward beyond the outer surfaces of those stiffening components. Exposing the end faces 20 in this manner allows heat dissipation devices 32 to be positioned in direct contact with the end faces 20, notwithstanding the addition of the stiffening components 4. Therefore, heat dissipation of the electrical component 6 is not impeded by the installation of the stiffening components 4.

Notwithstanding the above description, in alternate embodiments the stiffening component(s) 4 (or at least the stiffening portion(s) 8) can be attached to the electrical component 6 by way of other securing portions or mechanisms including, for example, one or more mechanical fasteners such as clamps/tabs or welding. Further, while the stiffening component 4 in the embodiment of FIGS. 1-2 involves the stiffening portion 8 and the securing portion 10, in other embodiments these two portions could be a unitary piece of material. For example, in at least some embodiments, a rigid or semi-rigid paint (that is, a paint that is rigid or semi-rigid when dry) could be applied to the electrical component 6 and thereby serve as the stiffening component 4. Additionally, while the stiffening component 4 is planar, other configurations, such as a corrugated shape, have been contemplated. The stiffening component 4 can include one or more additional portions comprising of the same or different materials.

Further, in regards to the electrical component 6, in at least one embodiment, the first end 18 of the electrical component 6 can be an anode of a semiconductor and the second end 34 can be a cathode. In one embodiment, a heat dissipation device 32 is secured to the first end 18, whereby the first end 18 is an anode, and another heat dissipation device 32 is secured to the second end 34, whereby the second end 34 is a cathode. Additionally, the electrical component 6 secured to the circuit board 30 can be a symmetrical gate commutated thyristor power semiconductor Part No. 80173-110, as provided by Rockwell Automation, Inc. of Milwaukee, Wis.

In some embodiments, the system 2 is suitable for use with a medium voltage AC motor drive unit, such as a PowerFlex 7000, as manufactured also by Rockwell Automation, Inc. A motor drive unit often houses various components such as, semiconductors, fans, relays and transformers that each can contribute to acoustic noise. It is often desirable for the motor drive unit to conform to the requirements of applicable standards such as IEEE and/or OSHA standards regarding acoustic noise levels. In at least some embodiments, the stiffening component(s) 4 serves to reduce acoustic noise that would otherwise be generated by the electrical component 6 (e.g. semiconductor), and therefore aids in the reduction of acoustic noise generated by the motor drive unit.

In addition, when the stiffening component 4 is used with an electrical component 6 that is situated in a housing (not shown), for example a motor drive unit, other acoustic noise reduction techniques can be applied to the housing to achieve additional noise reduction. In at least some embodiments, foams, acoustic louvers, and duct silencers can be situated on or adjacent the housing (e.g., along interior surfaces of walls or along interior surfaces of cooling air exit chambers) to further reduce the acoustic noise emitted from the housing.

One advantage of the stiffening component 4 over the aforementioned noise reduction techniques is that it does not create a physical barrier that can interfere with direct and/or assisted air cooling of the overall system. More particularly, the stiffening component does not interfere with the dissipation of heat from the electrical component 6.

Notwithstanding the above examples, the present invention is intended to encompass numerous other embodiments and/or applications, and/or to satisfy a variety of other performance levels or criteria, in addition to or instead of the above examples. It is specifically intended that the present invention not be limited to the embodiments and illustrations contained herein, but include modified forms of those embodiments including portions of the embodiments and combinations of elements of different embodiments as come within the scope of the following claims.

We claim:

1. A device for use in combination with an electrical component, the device comprising:
    a stiffening component securable to the electrical component, wherein the stiffening component is configured to provide rigidity to the electrical component,
    wherein the stiffening component is an annular structure defining an interior cavity, and is configured to be secured to the electrical component in a manner by which a portion of the electrical component extends through the interior cavity,
    whereby, due to the presence of the stiffening component, a level of acoustic noise resulting from operation of the electrical component is reduced relative to what the level would otherwise be if the stiffening component were absent.

2. The device of claim 1, wherein the stiffening component includes a stiffening portion made from a substantially rigid material.

3. The device of claim 2, wherein the stiffening component additionally includes a securing portion secured to the stiffening portion.

4. The device of claim 2, wherein the substantially rigid material is aluminum.

5. The device of claim 1, wherein the stiffening component includes a mineral fiber.

6. The device of claim 1, wherein the stiffening component includes an acoustic coating.

7. An electrical system including the electrical component and the device of claim 1, wherein the electrical component is a semiconductor device.

8. The system of claim 7, wherein the semiconductor device is a power semiconductor device including at least one of an insulated gate bipolar transistor (IGUT), a symmetrical gate commutated thyristor (SGCT), an integrated gate commutated thyristor (IGCT), a silicon-controlled rectifier (SCR), or another press-pack semiconductor device.

9. The system of claim 7, wherein the electrical system includes a circuit board of which the semiconductor device is a part.

10. An electrical system configured to operate with reduced acoustic noise generation, the system comprising:
    a first stiffening component having a stiffening portion secured to a securing portion,
    a semiconductor device having first and second sides with first and second end faces, respectively,
    wherein the first end face is a substantially planar end face, and wherein the first side also includes a flange portion that is situated about a perimeter of the first end face,
    wherein the first stiffening component is secured to the flange portion of the semiconductor device, thereby providing additional rigidity to the flange portion, and
    wherein a second stiffening component is secured to the second side and each end face is configured to be in contact with at least one heat sink.

11. The system of claim 10, wherein the semiconductor device is at least one of an insulated gate bipolar transistor (IGBT), a symmetrical gate commutated thyristor (SGCT), an integrated gate commutated thyristor (IGCT), a silicon-controlled rectifier (SCR), or another press-pack semiconductor device,
    whereby due to the presence of the stiffening components, a level or acoustic noise resulting from operation of the semiconductor device is reduced relative to what the level would otherwise be if the stiffening components were absent.

12. The system of claim 11, wherein the flange portion of the semiconductor device includes a substantially planar flange face, the flange face being substantially parallel to the first end face, wherein the first stiffening component is secured to the flange face of the electrical component such that it does not extend into a plane of the first end face.

13. The system of claim 12, wherein the first stiffening portion is comprised of aluminum and the securing portion is comprised of at least an adhesive.

14. The system of claim 13, wherein the first stiffening component is substantially planar and ring-shaped and has a height from about 0.2 millimeters to about 0.6 millimeters.

15. The system of claim 10, wherein the semiconductor device is positioned at least partially through an aperture in a circuit board.

16. The system of claim 10, wherein in the first stiffening component is an annular structure defining an interior cavity, and wherein the first stiffening component is configured to be secured to the semiconductor device in a manner by which a portion of the semiconductor device extends through the interior cavity.

17. An electrical system configured for operating with reduced acoustic noise generation, the system comprising:
    a stiffening component having a stiffening portion secured to a securing portion,
    a semiconductor device having at least one substantially planar end face with a flange portion situated about a perimeter of the end face, wherein the stiffening component is secured to the semiconductor device to provide additional rigidity to the flange portion,
    wherein the semiconductor device is at least one of an insulated gate bipolar transistor (IGBT), a symmetrical gate commutated thyristor (SGCT), an integrated gate commutated thyristor (IGCT), a silicon-controlled rectifier (SCR), or another press-pack semiconductor device; and
    wherein the flange portion of the semiconductor device includes a substantially planar flange face, the flange face being substantially parallel to the end face, wherein the stiffening component is secured to the flange face of the semiconductor device such that it does not extend into a plane of the end face.

18. The electrical system of claim 17, wherein the end face is in direct contact with a heat dissipation device.

19. A device for use in combination with an electrical component having a substantially planar end face and a flange portion with a substantially planar flange face that is positioned inwardly relative to, and extends substantially parallel to, the end face, the device comprising:

a stiffening component securable to the electrical component, wherein the stiffening component is configured to be secured to the flange face of the electrical component to provide rigidity to the electrical component, wherein the stiffening component is configured to be secured to the flange face of the electrical component in a manner by which the stiffening component does not extend into a plane of the end face, whereby, due to the presence of the stiffening component, a level of acoustic noise resulting from operation of the electrical component is reduced relative to what the level would otherwise be if the stiffening component were absent.

* * * * *